(12) United States Patent
Hashigami et al.

(10) Patent No.: US 10,998,463 B2
(45) Date of Patent: May 4, 2021

(54) HIGH EFFICIENCY SOLAR CELL AND METHOD FOR MANUFACTURING HIGH EFFICIENCY SOLAR CELL

(71) Applicant: SHIN-ETSU CHEMICAL CO., LTD., Tokyo (JP)

(72) Inventors: Hiroshi Hashigami, Annaka (JP); Shun Moriyama, Annaka (JP); Takenori Watabe, Annaka (JP); Hiroyuki Ohtsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/346,907

(22) PCT Filed: Nov. 15, 2016

(86) PCT No.: PCT/JP2016/004884
§ 371 (c)(1),
(2) Date: May 2, 2019

(87) PCT Pub. No.: WO2018/092172
PCT Pub. Date: May 24, 2018

(65) Prior Publication Data
US 2020/0058810 A1 Feb. 20, 2020

(51) Int. Cl.
*H01L 31/18* (2006.01)
*C08G 73/10* (2006.01)
(Continued)

(52) U.S. Cl.
CPC ........ *H01L 31/18* (2013.01); *C08G 73/1032* (2013.01); *G01N 23/2258* (2013.01);
(Continued)

(58) Field of Classification Search
CPC ........ H01L 31/02241; H01L 31/02245; H01L 31/022458; H01L 31/0516;
(Continued)

(56) References Cited

U.S. PATENT DOCUMENTS 5,120,573 A   6/1992   Miyazaki et al.
5,738,931 A   4/1998   Sato et al.
(Continued)

FOREIGN PATENT DOCUMENTS

EP   2 273 558 A1   1/2011
EP   3 343 643 A1   7/2018
(Continued)

OTHER PUBLICATIONS

Jan. 24, 2017 International Search Report issued in International Patent Application No. PCT/JP2016/004884.
(Continued)

*Primary Examiner* — Lindsey A Bernier
(74) *Attorney, Agent, or Firm* — Oliff PLC

(57) ABSTRACT

A solar cell including a semiconductor substrate having a first conductivity type an emitter region, having a second conductivity type opposite to the first conductivity type, on a first main surface of the semiconductor substrate an emitter electrode which is in contact with the emitter region a base region having the first conductivity type a base electrode which is in contact with the base region and an insulator film for preventing an electrical short-circuit between the emitter region and the base region, wherein the insulator film is made of a polyimide, and the insulator film has a $C_6H_{11}O_2$ detection count number of 100 or less when the insulator film is irradiated with $Bi_5^{++}$ ions with an acceleration voltage of 30 kV and an ion current of 0.2 pA by a
(Continued)

TOF-SIMS method. There can be provided a solar cell having excellent weather resistance and high photoelectric conversion characteristics.

2 Claims, 5 Drawing Sheets

(51) Int. Cl.
  *G01N 23/2258* (2018.01)
  *H01L 31/0216* (2014.01)
  *H01L 31/0224* (2006.01)
  *H01L 31/05* (2014.01)

(52) U.S. Cl.
  CPC .. *H01L 31/02167* (2013.01); *H01L 31/02245* (2013.01); *H01L 31/022441* (2013.01); *H01L 31/022458* (2013.01); *H01L 31/0516* (2013.01); *H01L 31/1804* (2013.01); *Y02E 10/547* (2013.01)

(58) Field of Classification Search
  CPC ............... H01L 31/02167; H01L 31/18; H01L 31/1804; C08G 73/1032
  See application file for complete search history.

(56) References Cited

U.S. PATENT DOCUMENTS

| | | |
|---|---|---|
| 2008/0017243 A1 | 1/2008 | De Ceuster et al. |
| 2009/0263745 A1 | 10/2009 | Sakayori |
| 2011/0030759 A1 | 2/2011 | Funakoshi |
| 2013/0213696 A1 | 8/2013 | Yamamoto et al. |
| 2013/0233381 A1* | 9/2013 | Win ................ H01L 31/02167 136/256 |
| 2014/0048131 A1 | 2/2014 | Tanaka et al. |
| 2015/0207023 A1* | 7/2015 | Nielson ............... H01L 31/1892 438/68 |
| 2017/0170338 A1 | 6/2017 | Matsuo et al. |
| 2017/0186894 A1 | 6/2017 | Endo et al. |
| 2018/0315869 A1 | 11/2018 | Hashigami et al. |

FOREIGN PATENT DOCUMENTS

| | | |
|---|---|---|
| JP | H01-129233 A | 5/1989 |
| JP | H02-167741 A | 6/1990 |
| JP | H06-073338 A | 3/1994 |
| JP | H08-148339 A | 6/1996 |
| JP | H10-004263 A | 1/1998 |
| JP | H10-171116 A | 6/1998 |
| JP | H11-052572 A | 2/1999 |
| JP | 2006-203056 A | 8/2006 |
| JP | 2009-263646 A | 11/2009 |
| JP | 2012-069594 A | 4/2012 |
| JP | 2015-026858 A | 2/2015 |
| JP | 2015-180721 A | 10/2015 |
| JP | 2016-072467 A | 5/2016 |
| TW | 201247067 A | 11/2012 |
| TW | 201315609 A | 4/2013 |
| WO | 2012/132193 A1 | 10/2012 |
| WO | 2015/190024 A1 | 12/2015 |
| WO | 2016/125430 A1 | 8/2016 |

OTHER PUBLICATIONS

Oct. 10, 2018 Extended European Search Report issued in European Patent Application No. 16886815.6.
May 22, 2018 Search Report issued in Taiwanese Patent Application No. 106107411.
Jun. 6, 2017 Office Action issued in Japanese Patent Application No. 2017-519703.
Sep. 12, 2017 Office Action issued in Japanese Patent Application No. 2017-519703.
Sep. 18, 2018 Office Action issued in Japanese Patent Application No. 2017-519703.
Jan. 22, 2019 Appeal Decision issued in Japanese Patent Application No. 2017-519703.
Sep. 25, 2018 Office Action issued in Japanese Patent Application No. 2017-236028.
Jan. 22, 2019 Office Action issued in Japanese Patent Application No. 2017-236028.
Van Der Wel H et al. "A combined TOF SIMS and FTIR MSR study on the analysis of several polyimide surfaces". Vacuum, vol. 41, No. 7-9, pp. 1651-1653, 1990.
May 21, 2019 International Preliminary Report on Patentability issued in International Patent Application No. PCT/JP2016/004884.

* cited by examiner

HIGH EFFICIENCY SOLAR CELL AND METHOD FOR MANUFACTURING HIGH EFFICIENCY SOLAR CELL

TECHNICAL FIELD

The present invention relates to a high efficiency solar cell and a method for manufacturing a high efficiency solar cell.

BACKGROUND ART

In recent years, a so-called back contact solar cell, in which no electrodes are provided on a light-receiving surface to eliminate optical loss caused by the shadow of electrodes, has been widely studied as a technique of improving the photoelectric conversion efficiency of a crystal silicon solar cell.

FIG. 11 is a schematic view showing an example of the back surface of the back contact solar cell, and FIG. 12 shows a part of a cross section taken along an alternate long and short dash line A in FIG. 11. As shown in FIG. 11, in a solar cell 1100, an emitter region (an emitter layer) 1112 is formed on the back surface (a first main surface) of a semiconductor substrate (e.g., a crystal silicon substrate) 1110. Further, base regions (base layers) 1113 are formed in a stripe pattern to sandwich the emitter region 1112 therebetween, emitter electrodes 1122 are formed on the emitter region 1112, and further a plurality of emitter electrodes 1122 are coupled through emitter bus bars (emitter bus bar electrodes) 1132. Further, base electrodes 1123 are formed on the base regions 1113, and a plurality of base electrodes 1123 are coupled through base bus bars (base bus bar electrodes) 1133. On the other hand, the base electrodes 1123 are electrically insulated from the emitter region 1112 through insulator films (insulator layers) 1118 and the emitter electrodes 1122 are electrically insulated from the base regions 1113 through the same. Furthermore, as shown in FIG. 12, the solar cell 1100 includes passivation films 1119 on the first main surface and a second main surface of the semiconductor substrate 1110. It is to be noted that the passivation film 1119 is omitted in FIG. 11.

A material used for the insulator films must have characteristics such as chemical stableness, high usable temperatures, or easiness of pattern formation. A polyimide resin has been often used for the insulator film due to such demands (e.g., Patent Literature 1).

The insulator film of the solar cell is formed by applying an insulation precursor (an insulator film precursor) to the substrate by screen printing, inkjet printing, or a dispensing method. As a precursor in case of applying a polyimide resin for formation, a solution containing a polyamic acid is generally used. In this case, the polyamic acid is thermally treated to advance dehydration reaction and imidization, whereby the polyimide resin is provided.

CITATION LIST

Patent Literature

Patent Literature 1: Japanese Unexamined Patent

SUMMARY OF INVENTION

Technical Problem

However, when a solar cell using the polyimide resin derived from the precursor containing a polyamic acid is put in a hot and humid state, there often occurs a problem that electrical contact between the substrate and electrodes in contact with the insulator is degraded.

The present invention has been made in view of the above problems, and an object thereof is to provide a solar cell which has excellent weather resistance and high photoelectric conversion characteristics and a method for manufacturing such a solar cell.

Solution to Problem

To achieve the object, the present invention provides a solar cell comprising: a semiconductor substrate having a first conductivity type; an emitter region, having a second conductivity type opposite to the first conductivity type, on a first main surface of the semiconductor substrate; an emitter electrode which is in contact with the emitter region; a base region having the first conductivity type; a base electrode which is in contact with the base region; and an insulator film for preventing an electrical short-circuit between the emitter region and the base region, wherein the insulator film is made of a polyimide, and the insulator film has a $C_6H_{11}O_2$ detection count number of 100 or less when the insulator film is irradiated with $Bi_5^{++}$ ions at an acceleration voltage of 30 kV and an ion current of 0.2 pA by a TOF-SIMS method.

Such a solar cell is superior in weather resistance and has high photoelectric conversion characteristics.

Additionally, it is preferable that the insulator film is formed to electrically insulate the emitter region from the base electrode.

Such a solar cell can avoid the electrical short-circuit of the emitter region and the base electrode by using the insulator film.

Additionally, it is preferable that the insulator film is formed to electrically insulate the base region from the emitter electrode.

Such a solar cell can avoid the electrical short-circuit of the base region and the emitter electrode by using the insulator film.

Additionally, it is preferable that the insulator film is formed to electrically insulate the emitter electrode from the base electrode.

Such a solar cell can avoid the electrical short-circuit of the emitter electrode and the base electrode by using the insulator film.

Additionally, it is preferable that the semiconductor substrate is a crystal silicon substrate.

When the semiconductor substrate is the crystal silicon substrate, the solar cell which has good power generation efficiency can be provided at low cost.

Furthermore, the present invention provides a photovoltaic module including solar cells according to the present invention electrically connected to each other.

The solar cells according to the present invention can be electrically connected to provide the photovoltaic module.

Furthermore, the present invention provides a photovoltaic power generation system including a plurality of photovoltaic modules according to the present invention connected to each other.

The plurality of photovoltaic modules each of which is constituted by electrically connecting the solar cells according to the present invention can be connected to provide the photovoltaic power generation system.

Furthermore, the present invention provides a method for manufacturing a solar cell comprising the steps of:

forming, on a first main surface of a semiconductor substrate having a first conductivity type, an emitter region having a second conductivity type opposite to the first conductivity type, and a base region having the first conductivity type;

forming an emitter electrode which is in contact with the emitter region and a base electrode which is in contact with the base region; and forming a polyimide containing no carboxy group as an insulator film for preventing an electrical short-circuit between the emitter region and the base region.

According to such a method, it is possible to manufacture the solar cell which has excellent weather resistance and high photoelectric conversion characteristics.

Additionally, it is preferable to use a crystal silicon substrate as the semiconductor substrate.

The method according to the present invention is particularly preferable for manufacture of the solar cell including the crystal silicon substrate.

Advantageous Effects of Invention

The solar cell of the present invention is superior in weather resistance and has high photoelectric conversion characteristics. According to the method of the present invention, it is possible to provide a back contact solar cell which has high efficiency and excellent weather resistance without requiring a process change.

DESCRIPTION OF EMBODIMENTS

The present invention will now be described in detail hereinafter.

As described above, a solar cell which is superior in weather resistance and has high photoelectric conversion characteristics has been demanded.

The present inventors have conducted the earnest examinations to achieve the object. Consequently, they have found that the problem can be solved by a solar cell including: a semiconductor substrate having a first conductivity type; an emitter region, having a second conductivity type opposite to the first conductivity type, on a first main surface of the semiconductor substrate; an emitter electrode which is in contact with the emitter region; a base region having the first conductivity type; a base electrode which is in contact with the base region; and an insulator film for preventing an electrical short-circuit between the emitter region and the base region, wherein the insulator film is made of a polyimide, and the insulator film has a $C_6H_{11}O_2$ detection count number of 100 or less when the insulator film is irradiated with $Bi_5^{++}$ ions at an acceleration voltage of 30 kV and an ion current of 0.2 pA by a TOF-SIMS method, thereby bringing the present invention to completion.

As described above, a method for manufacturing a solar cell which is superior in weather resistance and has high photoelectric conversion characteristics has been demanded.

The present inventors have conducted the earnest examinations to achieve the object. Consequently, they have found that the problem can be solved by a method for manufacturing a solar cell including the steps of:

forming, on a first main surface of a semiconductor substrate having a first conductivity type, an emitter region having a second conductivity type opposite to the first conductivity type, and a base region having the first conductivity type;

forming an emitter electrode which is in contact with the emitter region and a base electrode which is in contact with the base region; and forming a polyimide containing no carboxy group as an insulator film for preventing an electrical short-circuit between the emitter region and the base region, thereby bringing the present invention to completion.

Hereinafter, embodiments of the present invention will now be specifically described with reference to the drawings, but the present invention is not restricted thereto.

[Solar Cell]

Figure 1:
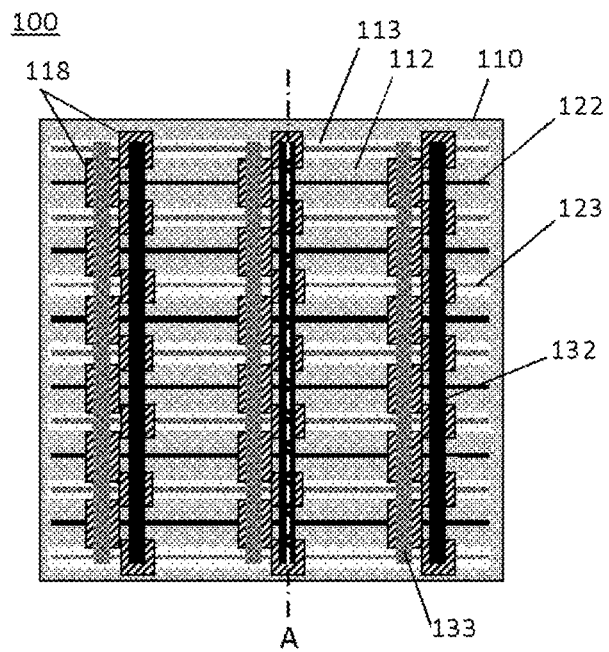
FIG. 1 is a view showing a backside structure of a back contact solar cell according to the present invention.
Figure 2:
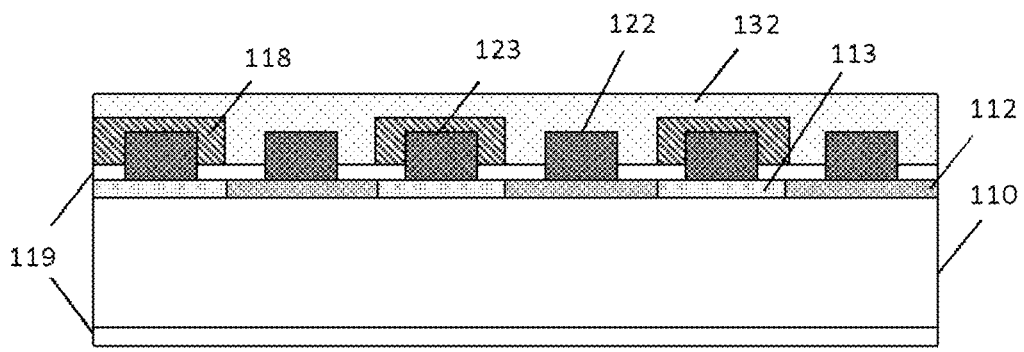
FIG. 2 is a view showing a cross-sectional structure of the back contact solar cell according to the present invention.

Although a solar cell according to the present invention will now be described hereinafter with reference to the drawings, the present invention is not restricted thereto. FIG. 1 is a view showing a backside structure of a back contact solar cell according to the present invention. Further, FIG. 2 is a view showing a cross-sectional structure of the back contact solar cell according to the present invention, and shows a part of a cross section taken along an alternate long and short dash line A in FIG. 1. As shown in FIGS. 1 and 2, a solar cell 100 according to the present invention includes a semiconductor substrate 110 having a first conductivity type. Furthermore, on a first main surface of the semiconductor substrate 110 are provided an emitter region 112 having a second conductivity type opposite to the first conductivity type, emitter electrodes 122 which are in contact with the emitter region 112, base regions 113 having the first conductivity type, base electrodes 123 which are in contact with the base regions 113, and insulator films 118 which prevent an electrical short-circuit between the emitter region 112 and the base regions 113.

Moreover, as shown in FIG. 1, the solar cell 100 according to the present invention usually includes base bus bars 133 configured to further collect currents which can be provided from the base electrodes 123. Additionally, it usually includes emitter bus bars 132 configured to further collect currents which can be provided from the emitter electrodes 122. Further, as shown in FIG. 2, passivation films 119 are usually provided on the first main surface and a second main surface of the semiconductor substrate 110. It is to be noted that the passivation film 119 is omitted in FIG. 1.

In the solar cell according to the present invention, the insulator film 118 is made of a polyimide and has a $C_6H_{11}O_2$ detection count number of 100 or less when the insulator film 118 is irradiated with ions (divalent ions of a bismuth pentamer) at an acceleration voltage of 30 kV and an ion current of 0.2 pA (picoampere) by a time-of-flight secondary ion mass spectrometry (TOF-SIMS) method. This detection count number is approximately a detection lower limit of the TOF-SIMS. Further, an organic substance containing a carboxy group can be detected as, e.g., a peak of $C_6H_{11}O_2$ whose m/z value (m: an ion mass number, z: an ion charge number) appears in the vicinity of 115 in secondary ions ejected by Bi ion irradiation in the TOS-SIMS. Thus, it can be said that, in the solar cell according to the present invention, each insulator film is made of a polyimide which hardly contains carboxy groups or does not contain the same at all. When an organic substance containing carboxy groups remains in the insulator film, i.e., when the count number exceeds 100, weather resistance is considerably lowered. Although reasons for this are yet to be clear, it can be considered that a carboxylic acid is generated from the carboxy group derived from an amic acid with moisture absorption of the insulator film and acts on electrodes themselves or an interface between the electrodes and silicon to degrade electric resistance.

Although the shape of the insulator film is not restricted in particular, it may be, e.g., a rectangular shape. In this case, the length of one side of the insulator film may be, e.g., 0.01 mm to 50 mm. Further, the thickness of the insulator film may be, e.g., 1 to 60 µm. Adopting such length and thickness enables further improving insulation properties. Furthermore, since the insulator films are not excessively formed, it is possible to assuredly manufacture a desired solar cell, namely, a solar cell in which each insulator film is made of a polyimide containing no carboxy group.

Moreover, as shown in FIG. 1, it is preferable to form the solar cell 100 according to the present invention so that the insulator films 118 electrically insulate the emitter region 112 from the base electrodes 123. Such a solar cell enables avoiding an electrical short-circuit between the emitter region and the base electrodes by using the insulator films.

Additionally, as shown in FIG. 1, it is preferable to form the solar cell 100 according to the present invention so that the insulator films 118 electrically insulate the base regions 113 from the emitter electrodes 122. Such a solar cell enables avoiding an electrical short-circuit between the base regions and the emitter electrodes.

Further, as shown in FIG. 1, it is preferable to form the solar cell 100 according to the present invention so that the insulator films 118 electrically insulate the emitter electrodes 122 from the base electrodes 123. Such a solar cell enables avoiding an electrical short-circuit between the emitter electrodes and the base electrodes.

Furthermore, it is preferable for the semiconductor substrate 110 to be a crystal silicon substrate. When the semiconductor substrate is the crystal silicon substrate in this manner, the solar cell with the good power generation efficiency can be provided at low costs.

[Method for Manufacturing Solar Cell]

Although the method according to the present invention can be applied to general solar cells using insulators, an example of the method will now be described. For example, the method according to the present invention can be applied to the solar cell shown in FIGS. 1 and 2. Hereinafter, a specific method for manufacturing a solar cell will be described with reference to FIGS. 1 and 2 in conjunction with a case using an N-type substrate.

First, an N-type semiconductor substrate such as an N-type crystal silicon substrate is prepared. Specifically, high-purity silicon may be doped with a pentad such as phosphorous, arsenic, or antimony to prepare an as-cut single crystal {100} N-type silicon substrate having a specific resistance of 0.1 to 5 Ω·cm.

Next, small irregularities called a texture may be formed on a light receiving surface of the semiconductor substrate to reduce reflectance of the solar cell.

Then, as shown in FIGS. 1 and 2, an emitter region 112 having a second conductivity type opposite to that of the semiconductor substrate 110 and base regions 113 having a first conductivity type equal to that of the semiconductor substrate 110 are formed on the back surface (a first main surface) of the semiconductor substrate 110. A method for forming the emitter region 112 and the base regions 113 is not restricted in particular, and a well-known method can be used. For example, the emitter region 112 can be formed by vapor phase diffusion using $BBr_3$ or the like. The base regions 113 can be formed by vapor phase diffusion using phosphorous oxychloride. Furthermore, when the emitter region 112 and the base regions 113 are formed, a diffusion mask composed of a silicon oxide film, a silicon nitride film, or the like may be used to form the emitter region 112 and the base regions 113 with desired shapes. For example, as shown in FIG. 1, stripe-shaped base regions 113 may be formed, while emitter region 112 are formed except for areas where the base regions 113 are formed.

Then, a passivation film 119 constituted of a silicon nitride film, a silicon oxide film, or the like is formed on each of the light receiving surface and the back surface of the semiconductor substrate 110. The silicon nitride film can be formed by a CVD method, and the silicon oxide film can be formed by the CVD method or a thermal oxidation method.

Then, emitter electrodes 122 which are in contact with the emitter region 112, and base electrodes 123 which are in contact with the base regions 113 are formed. In case of the solar cell having the backside structure shown in FIG. 1, the emitter electrodes 122 and the base electrodes 123 which extend in a horizontal direction are formed on the emitter region 112 and the base regions 113.

Although a method for forming the electrodes is not restricted in particular, they could be formed by screen printing or dispenser formation using a conductive paste in terms of productivity. In this case, the emitter electrodes 122 and the base electrodes 123 are formed as follows: an Ag paste obtained by mixing Ag powder and glass frit with an organic binder is applied to the emitter region 112 and the base regions 113 with the passivation film 119 being inserted; the Ag paste is then dried; and the Ag paste is fired at about 700 to 880° C. for 1 to 30 minutes. As a result of this heat treatment, the passivation film 119 is eroded by the Ag paste, whereby the electrodes make electrical contact with the silicon.

Furthermore, plating may be applied. In this case, since the substrate surface is necessarily exposed at positions where the electrodes are to be formed, the passivation film 119 at such positions is removed by, e.g., laser ablation.

Then, a polyimide containing no carboxy group is formed as the insulator films 118 for preventing an electrical short-circuit between the emitter region 112 and the base regions 113. In case of the solar cell having the backside structure shown in FIG. 1, the insulator films 118 are formed at intersecting points of the emitter region 112 and base bus bars 133 and intersecting points of the base regions 113 and emitter bus bars 132.

Although a method for forming the insulator films is not restricted in particular, the film is preferably formed by applying a paste of an insulation precursor by screen printing, inkjet printing, or dispensed coating in terms of productivity. In this case, although a process differs to some extent depending on the insulation precursor to be used, it is often the case that the precursor is printed and thereafter dried in the air at approximately 70° C. to 150° C. for approximately one minute to 10 minutes, and then an actual curing is performed. Although an actual curing method also varies depending on the insulation precursor, it may be a thermosetting type, a UV (ultraviolet) curing type, or the like. As heat treatment conditions for performing the actual curing, for example, heat treatment can be carried out in the air at 200° C. to 400° C. for approximately 10 seconds to 15 minutes. However, each insulator film 118 is made of a polyimide containing no carboxy group.

Here, an organic substance containing carboxy groups can be detected as, e.g., a peak of $C_6H_{11}O_2$ whose m/z value (m: an ion mass number, z: an ion charge number) appears in the vicinity of 115 in secondary ions ejected by Bi ion irradiation in the TOS-SIMS. Thus, in the method according to the present invention, an actually cured insulator film having a $C_6H_{11}O_2$ detection count number of 100 or less when it is irradiated with $Bi_5^{++}$ ions at an acceleration voltage of 30 kV and an ion current of 0.2 pA by the TOF-SIMS method can be regarded as the insulator film made of a polyimide containing no carboxy group. It is to be noted that the detection count number (100) is roughly a detection lower limit of the TOF-SIMS method.

When the organic substance containing carboxy groups remains in the insulator film, the weather resistance is considerably lowered. Although reasons for this are yet to be clear, it can be considered that a carboxylic acid is generated from the carboxy group derived from an amic acid with moisture absorption of the insulator film and acts on electrodes themselves or an interface between the electrodes and silicon to degrade electric resistance.

As described above, an amic acid solution is dehydrated/imidized by heat treatment, but imidization is partially incomplete due to a coating film thickness, heat treatment conditions, or the like, and the precursor remains in some situations. In such a case, there is a possibility that optimizing the coating film thickness and the heat treatment conditions can avoid the problem.

However, it is preferable to use an insulator film precursor containing no amic acid. In this case, for example, a soluble polyimide coating agent using a soluble polyimide described in Japanese Unexamined Patent Application Publication No. 2015-180721 can be adopted.

The soluble polyimide will now be described hereinafter. The soluble polyimide is, e.g., a polyimide powder provided by a solid phase polymerization method, and this polyimide can be the polyimide powder which is soluble in an amide solvent and whose weight-average molecular weight based on GPC (gel permeation chromatography) is 10000 or more.

Illustrative examples of the amide solvent include N-methyl-2-pyrolidone (NMP), N,N-dimethylformamide (DMF), N,N-dimethylacetamide (DMAc), and the like.

Furthermore, the polyimide powder can be manufactured by solid-phase-polymerizing a salt consisting of a tetracarboxylic acid or a tetracarboxylic diester and diamine in the presence of a solvent in an amount of 1 mass % or more and 30 mass % or less with respect to a mass of this salt.

Here, the solid phase polymerization method is a method for advancing polymerization reaction in a solid state.

Here, the tetracarboxylic diester means a tetracarboxylic acid dimethyl ester, a tetracarboxylic acid diethyl ester, a tetracarboxylic diisopropyl acid ester, or the like.

Preferred examples of the tetracarboxylic acid include cyclohexane-1,2,4,5-tetracarboxylic acid (H-PMA), pyromellitic acid (PMA), 3,3',4,4'-biphenyltetracarboxylic acid (BPA), 2,2-bis(3,4-dicarboxyphenyl) hexafluoropropane (6-FA), diesters of these substances, and the like.

Preferred examples of the diamine include 4,4'-diaminodiphenyl ether (DADE), 2,2-bis[4-(4-aminophenyxy)phenyl]propane (BAPP), 1,3-bis(aminomethyl) cyclohexane (AMC), isophoronediamine (IPDA), 2,2-bis[4-(4-aminophenoxy)phenyl]hexafluoropropane (6F-BAPP), polypropylene glycol bis(2-aminoethyl) ether (PGAE), and the like.

The solvent used in the solid phase polymerization is a solvent which can dissolve the polyimide powder to be generated by the solid phase polymerization. Illustrative examples thereof include general solvents such as an amide solvent, an ether solvent, a water ester solvent, a ketone solvent, and the like; and the amide solvent is preferred. As the amide solvent, NMP, DMF, DMAc, or the like described above can be used.

Next, an insulator film made of the soluble polyimide and an amic acid type insulator film will be described with reference to FIG. 3.

Figure 3:
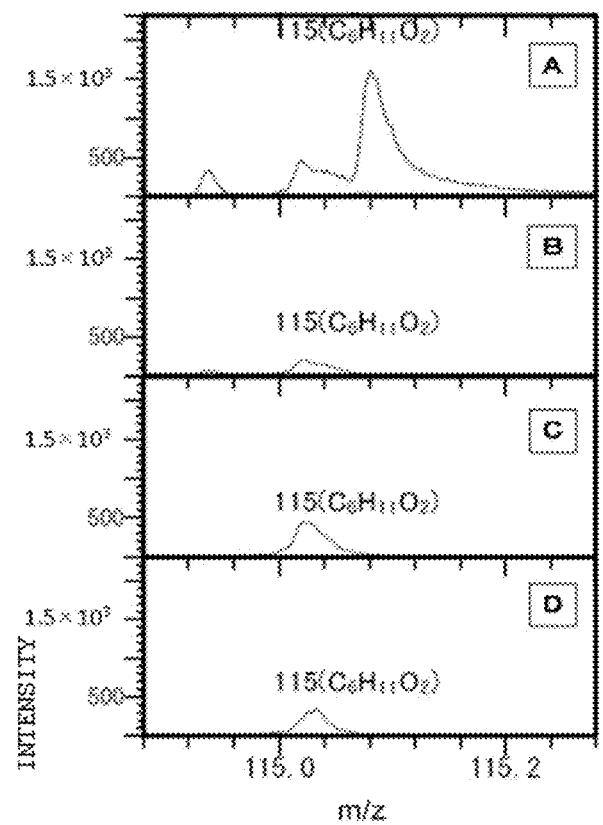
FIG. 3 is a graph showing ion intensity spectrums in TOF-SIMS analysis of an insulator film.

FIG. 3 shows spectrums in the vicinity of m/z=115 provided as a result of irradiating four types of cured insulator films A, B, C, and D with $Bi_5^{++}$ ions at an acceleration voltage of 30 kV and an ion current of 0.2 pA by using the TOF-SIMS (TOF-SIMS300 manufactured by ION-TOF). Of these films, the sample A is an amic acid type polyimide film that is cured by, after coating and drying at 90° C. for five minutes, heat treatment at 250° C. for 10 minutes. In this sample, a clear peak of $C_6H_{11}O_2$ can be observed at m/z=115.08, which indicates that the film is incompletely imidized. On the other hand, the samples B to D are polyimide films made of soluble polyimides having different compositions, but a peak derived from the amic acid, which can be seen in the sample A, cannot be observed in these samples. Table 1 shows the details of the insulator films A, B, C, and D.

TABLE 1

| Insulator film | Film thickness | Heat treatment conditions | Type of insulator film precursor | $C_6H_{11}O_2$ detection count number | Composition of insulator film precursor (volume %) | | |
|---|---|---|---|---|---|---|---|
| | | | | | Resin component | Solvent | Others |
| A | about 20 μm | drying at 90° C. for 5 | Amic acid solution | about 1600 | 30 | 67 | 3 |

TABLE 1-continued

| Insulator film | Film thickness | Heat treatment conditions | Type of insulator film precursor | $C_6H_{11}O_2$ detection count number | Composition of insulator film precursor (volume %) | | |
|---|---|---|---|---|---|---|---|
| | | | | | Resin component | Solvent | Others |
| B | | minutes, curing at 250° C. for 10 minutes | Soluble polyimide coating agent | 100 or less | 25 | 66 | 9 |
| C | | | | | 26 | 69 | 5 |
| D | | | | | 30 | 65 | 5 |

As shown in Table 1, when the soluble polyimide coating agent is used as the insulator film precursor containing no amic acid, a polyimide containing no carboxy group can be easily formed as the insulator film 118.

After forming the insulator film 118, the emitter bus bars 132 and the base bus bars 133 are formed. A thermosetting conductive paste which is curable at room temperature to 350° C. or a UV curable conductive paste can be used for these bus bars, and such a paste could be applied by screen printing or dispenser formation. As shown in FIG. 1, the insulator films 118 can electrically insulate the emitter electrodes 122 from the base bus bars 133 and also electrically insulate the base electrodes 123 from the emitter bus bars 132, while the emitter electrodes 122 and the emitter bus bars 132 can be configured to be electrically continuous, and the base electrodes 123 and the base bus bars 133 can be configured to be electrically continuous.

According to the method of the present invention, it is possible to provide a back contact solar cell having excellent durability and high efficiency. Although the foregoing examples are in conjunction with the case where the substrate is an N-type substrate, the method of the present invention can also be applied to a case where the substrate is a P-type substrate. That is, an N-type layer may be provided as an emitter layer while a P-type layer may be provided as a base layer.

Figure 4:
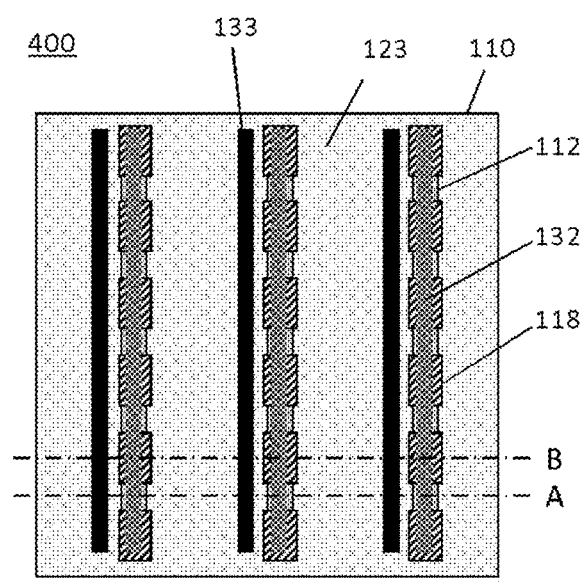
FIG. 4 is a view showing a backside structure of a back contact solar cell according to another embodiment of the present invention.
Figure 5:
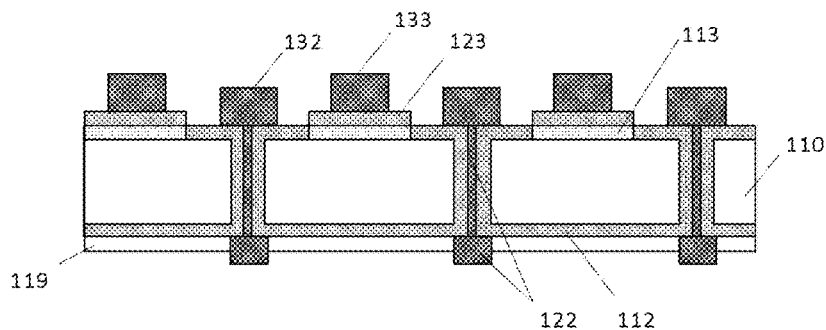
FIG. 5 is a view showing a cross-sectional structure of the back contact solar cell according to another embodiment of the present invention.
Figure 6:
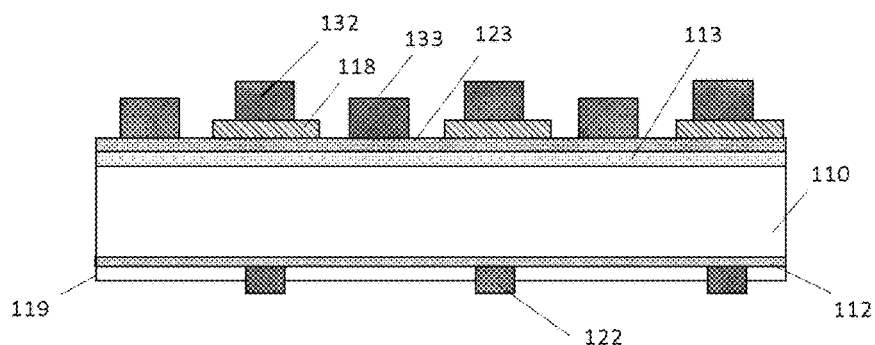
FIG. 6 is a view showing a cross-sectional structure of the back contact solar cell at a different position according to another embodiment of the present invention.

The present invention can be also applied to solar cells shown in FIGS. 4 to 8. FIG. 4 is a view showing a back surface of an emitter-wrap-through solar cell 400 as a solar cell according to another embodiment of the present invention, and each of FIG. 5 (a cross-sectional view taken along an alternate long and short dash line A) and FIG. 6 (a cross-sectional view taken along an alternate long and short dash line B) shows a part of a cross section taken along the alternate long and short dash line A or B in FIG. 4. In FIGS. 5 and 6, the light receiving surface faces downward.

In this embodiment, most part of the back surface of a substrate 110 is occupied by a base region 113 and base electrodes 123 formed on the base region 113, and emitter regions 112 are formed into island shapes in regions sandwiched between insulator films 118. On the other hand, a light receiving surface is occupied by an emitter region 112 that communicates with the emitter regions 112 on the back surface through via holes opened in the substrate 110. Moreover, emitter electrodes 122 are connected between the light-receiving surface and the back surface through the via holes. A passivation film 119 is formed on the light receiving surface. Furthermore, base bus bars 133 are linearly formed on the base electrode 123 on the back surface of the substrate 110. Moreover, emitter bus bars 132 are linearly formed on the emitter regions 112 and the emitter electrodes 122 on the back surface of the substrate 110. However, as shown in FIG. 6, in each region where the emitter bus bar 132 crosses the base electrode 123, the base electrode 123 is covered with the insulator film 118.

Figure 7:
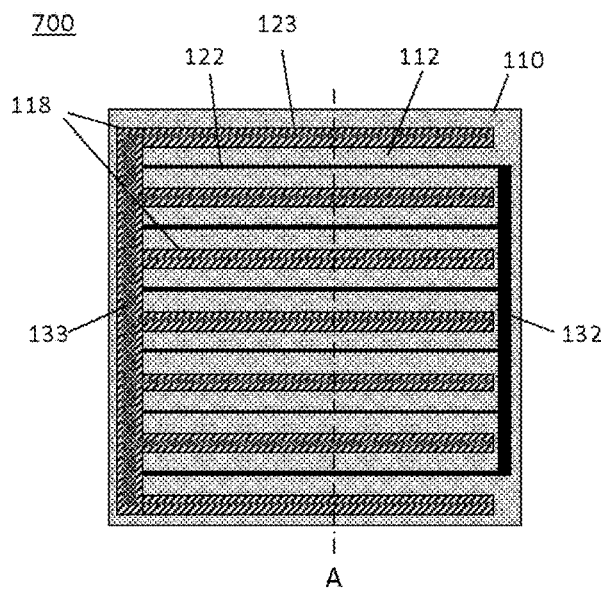
FIG. 7 is a view showing a backside structure of a back contact solar cell of still another embodiment according to the present invention.
Figure 8:
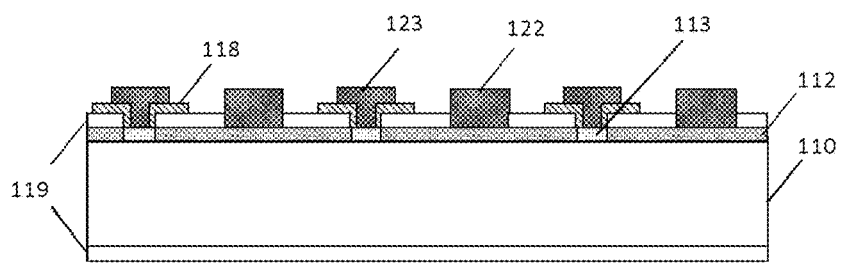
FIG. 8 is a view showing a cross-sectional structure of the back contact solar cell of still another embodiment according to the present invention.

FIG. 7 is a view showing the back surface of a solar cell 700 of still another embodiment according to the present invention, and FIG. 8 is a cross-sectional view showing a part of a cross section taken along an alternate long and short dash line A in FIG. 7. In this embodiment, base regions 113 on the back surface of a substrate 110 are formed in such a manner that they are surrounded by an emitter region 112, and each base electrode 123 is in contact with the base region 113 and insulated from a passivation film 119 through an insulator film 118 in a portion where the base electrode 123 overlaps the emitter region 112. It is to be noted that both a passivation effect and insulation performance cannot be generally achieved in the passivation film 119 in most cases, and hence it is preferable to assuredly achieve insulation by using an insulator. The passivation film 119 is omitted in FIG. 7. Additionally, at an outer peripheral portion of the back surface of the substrate 110, an emitter bus bar 132 which is coupled with a plurality of emitter electrodes 122 is formed, and a base bus bar 133 which is coupled with a plurality of base electrodes 123 is formed.

Further, FIG. 7 shows that each base region 113 is linearly formed below the base electrode 123, but the present invention is not restricted thereto, each base region 113 may be formed into a dot shape and these regions may be linearly aligned. In this case, the base electrodes 123 are formed in such a manner that they are insulated from the emitter region 112 through the insulator films 118 and connect the base regions 113.

[Photovoltaic Module]

Figure 9:
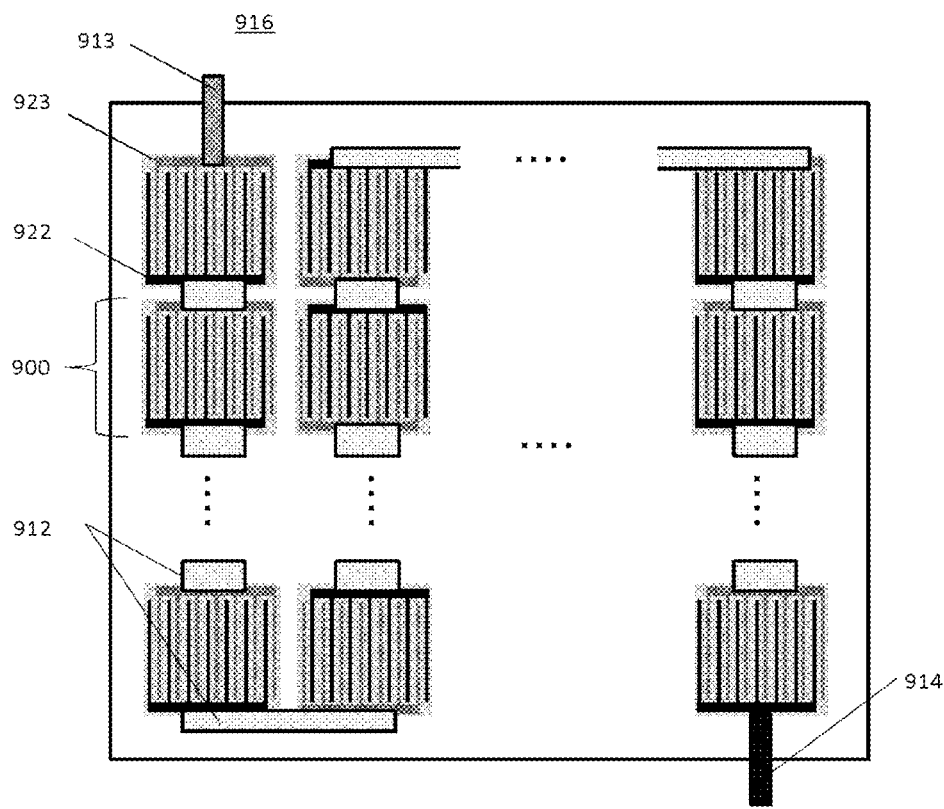
FIG. 9 is a view showing a photovoltaic module according to the present invention.

A photovoltaic module according to the present invention is constituted by electrically connecting the solar cells according to the present invention. For example, when a plurality of solar cells as provided above are electrically connected in series, a photovoltaic module is provided. FIG. 9 shows an example of a photovoltaic module 916. A positive electrode 923 of a solar cell is electrically connected to a negative electrode 922 of an adjacent solar cell through a tab 912, and the number of solar cells (solar battery cells) 900 required for a predetermined output are connected. Although not shown, the connected solar cells 900 are sealed with a cover glass, a filter, and further a back sheet. As the cover glass, a soda-lime glass is extensively used. Further, as the filler, ethylene vinyl acetate, polyolefin, silicone, or the like is used. As the back sheet, a functional film using polyethylene terephthalate is generally adopted. In addition, the positive electrode 923 of one solar cell is connected with a positive electrode terminal 913 of the photovoltaic module 916, and the negative electrode 922 of another solar cell is connected with a negative electrode terminal 914 of the photovoltaic module 916.

[Photovoltaic Power Generation System]

A photovoltaic power generation system according to the present invention is constituted by connecting a plurality of photovoltaic modules according to the present invention.

Figure 10:
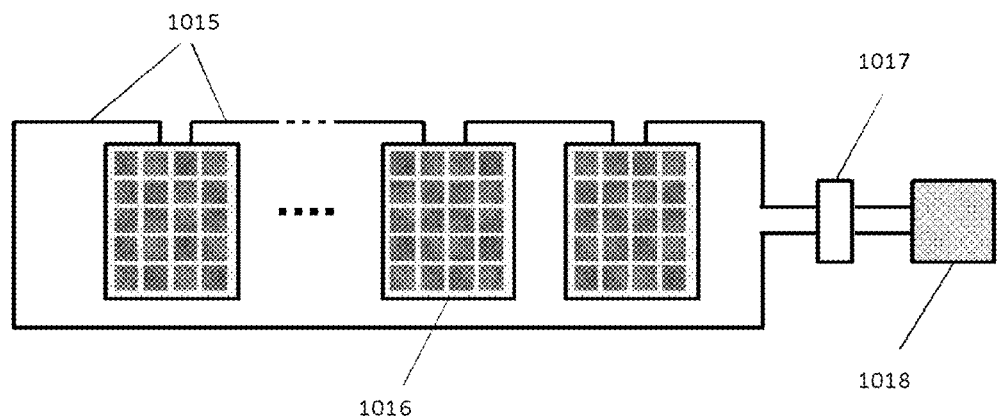
FIG. 10 is a view showing a photovoltaic power generation system according to the present invention.
Figure 11:
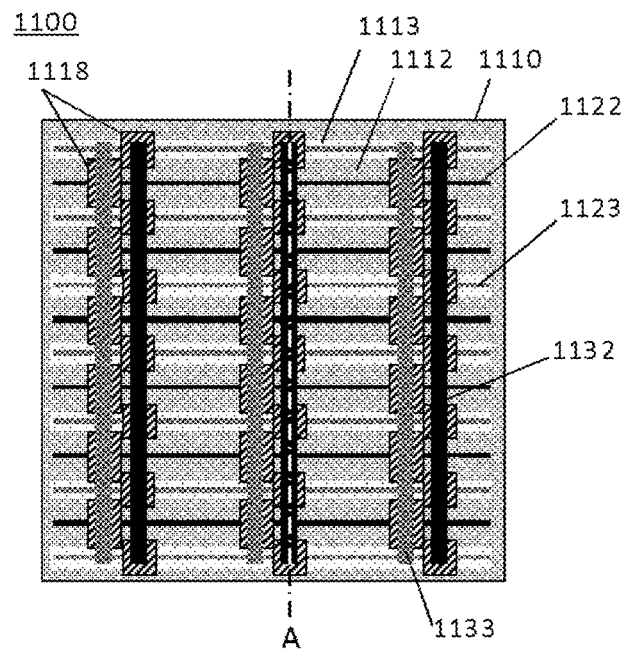
FIG. 11 is a view showing a backside structure of a general back contact solar cell.
Figure 12:
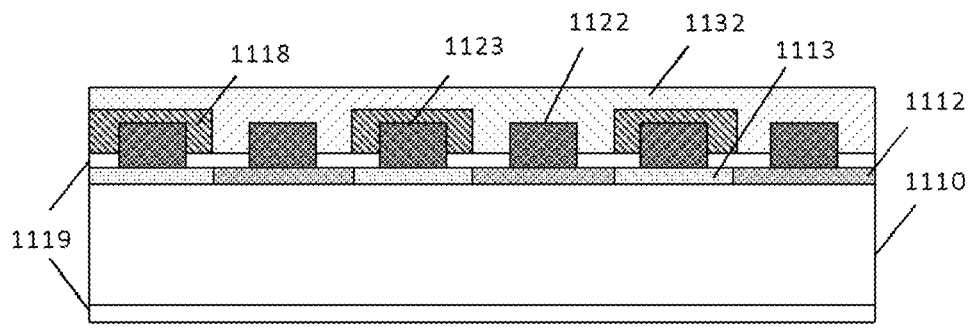
FIG. 12 is a view showing a cross-sectional structure of the general back contact solar cell.

FIG. 10 shows a basic structure of a photovoltaic power generation system provided by coupling the modules of the present invention with each other. As shown in FIG. 10, a plurality of photovoltaic modules 1016 are coupled in series through wiring 1015 and supply generated power to an external load circuit 1018 via an inverter 1017. Although not shown in this drawing, this system may further include a secondary battery which stores the generated power.

EXAMPLES

Although the present invention will now be more specifically described hereinafter with reference to examples and a comparative example, the present invention is not restricted to the following examples.

Example 1

A solar cell shown in FIGS. 1 and 2 was manufactured by using the method according to the present invention.

Using a phosphorous-doped <100> n-type as-cut silicon substrate having a size of 150 mm square, a thickness of 200 μm, and a specific resistance of 1 Ω·cm, an emitter region and base regions were formed on the back surface of the substrate as shown in FIG. 1.

This substrate was thermally treated in an oxygen atmosphere at 900° C. for 10 minutes, and oxide silicon films were formed on both surfaces of the substrate. Subsequently, silicon nitride films with a film thickness of 90 nm were further formed on both the surfaces of the substrate by plasma CVD.

Then, an Ag paste was applied to the emitter region and the base regions by screen printing, and heat treatment was performed at 800° C. for three seconds to cure the Ag paste, thereby forming emitter electrodes and base electrodes.

Then, an insulator film B in FIG. 3 was formed on a part of the emitter region and a part of the base electrode by screen printing. It is to be noted that conditions and others for forming the insulator film B are as described in Table 1.

Subsequently, to form emitter bus bars and base bus bars, a thermosetting Ag paste was applied by screen printing, and a heat treatment was performed at 200° C. for five minutes to cure the paste, thereby providing a solar cell.

Conductive wires are soldered to the bus bars in the solar cell and sealed with a white glass plate, a silicon resin, and a back sheet to fabricate a single cell module.

Initial output characteristics of the manufactured single cell module were measured by using pseudo sunlight of a xenon lamp light source type, then the module was stored in a temperature and humidity testing chamber set to 85° C. and 85% relative humidity for 2000 hours, and thereafter the measurement was again performed.

Example 2

In the same solar cell manufacturing process using the same substrate as that in Example 1, as an insulator film which is formed on a part of the emitter region and a part of the base electrode, an insulator film C in FIG. 3 was used to manufacture a solar cell. It is to be noted that conditions and others for forming the insulator film C are as described in Table 1.

Then, a single cell module was manufactured in the same manner as in Example 1.

Initial output characteristics of the manufactured single cell module were measured by using pseudo sunlight of a xenon lamp light source type, then the module was stored in a temperature and humidity testing chamber set to 85° C. and 85% relative humidity for 2000 hours, and thereafter the measurement was again performed.

Comparative Example 1

In the same solar cell manufacturing process using the same substrate as that in Example 1, as an insulator film which is formed on a part of the emitter region and a part of the base electrode, an insulator film A in FIG. 3 was applied to manufacture a solar cell. It is to be noted that conditions and others for forming the insulator film A are as described in Table 1.

Then, a single cell module was manufactured in the same manner as in Example 1.

Initial output characteristics of the manufactured single cell module were measured by using pseudo sunlight of a xenon lamp light source type, then the module was stored in a temperature and humidity testing chamber set to 85° C. and 85% relative humidity for 2000 hours, and thereafter the measurement was again performed.

Table 2 shows the solar cell initial characteristics and characteristic decreasing rate after elapse of 2000 hours of the high temperature and high humidity test according to Examples 1 and 2 and Comparative Example 1 described above.

TABLE 2

| Solar cell characteristics | | Example 1 | Example 2 | Comparative Example 1 |
|---|---|---|---|---|
| Short-circuit current [mA/cm$^2$] | Initial stage | 39.4 | 39.5 | 39.4 |
| | After 2000 hours (decreasing rate %) | 39.4 (0.0) | 39.4 (0.3) | 38.2 (3.0) |
| Open circuit voltage [V] | Initial stage | 0.680 | 0.679 | 0.679 |
| | After 2000 hours (decreasing rate %) | 0.680 (0.0) | 0.680 (−0.1) | 0.679 (0.0) |
| Fill factor [%] | Initial stage | 80.9 | 80.7 | 81.0 |
| | After 2000 hours (decreasing rate %) | 80.5 (0.5) | 80.5 (0.2) | 72.0 (11.1) |
| Conversion efficiency [%] | Initial stage | 21.7 | 21.6 | 21.7 |
| | After 2000 hours (decreasing rate %) | 21.6 (0.5) | 21.6 (0.4) | 18.7 (13.8) |

As shown in Table 2, the initial characteristics of each of Example 1 and Example 2 (examples where the polyimide containing no carboxy group was formed as the insulator film) were comparable to those of Comparative Example 1 (an example where the polyimide containing carboxy groups was formed as the insulator film), but had greatly improved durability. This result shows that the solar cell with high efficiency and high weather resistance can be achieved by the present invention without requiring any additional step.

It is to be noted that the present invention is not restricted to the foregoing embodiment. The foregoing embodiment is an illustrative example, and any example which has substantially the same configuration and exerts the same functions and effects as the technical concept described in claims of the present invention is included in the technical scope of the present invention.

The invention claimed is:

1. A method for manufacturing a solar cell comprising the steps of:
   forming, on a first main surface of a semiconductor substrate having a first conductivity type, an emitter region having a second conductivity type opposite to the first conductivity type, and a base region having the first conductivity type;
   forming an emitter electrode which is in contact with the emitter region and a base electrode which is in contact with the base region; and
   forming a polyimide containing no carboxy group, as an insulator film, from an insulator film precursor containing no amic acid, wherein the insulator film is configured to prevent an electrical short-circuit between the emitter region and the base region.

2. The method for manufacturing a solar cell according to claim 1, wherein a crystal silicon substrate is used as the semiconductor substrate.

* * * * *